United States Patent [19]

Macdonald

[11] Patent Number: 4,537,663
[45] Date of Patent: Aug. 27, 1985

[54] METHOD OF AND APPARATUS FOR PLATING USING CONTROLLED PROGRESSIVE IMMERSION

[75] Inventor: David I. Macdonald, Revere, Mass.

[73] Assignee: AT&T Technologies, Inc., Berkeley Heights, N.J.

[21] Appl. No.: 402,406

[22] Filed: Jul. 27, 1982

[51] Int. Cl.³ .......... C25D 5/04; C25D 17/00; C25D 17/06
[52] U.S. Cl. .................... 204/14.1; 204/15; 204/46 G; 204/225
[58] Field of Search ............... 204/DIG. 7, 225, 226, 204/15, 14 R, 1 R, 45 R, 46 G

[56] References Cited

U.S. PATENT DOCUMENTS

| 1,939,902 | 12/1933 | Kaul | 204/15 X |
| 2,750,332 | 6/1956 | Miller | 204/15 |
| 3,388,047 | 6/1968 | Higgins | 204/15 |
| 4,028,198 | 6/1977 | Tuscher et al. | 204/9 |

Primary Examiner—G. L. Kaplan
Attorney, Agent, or Firm—D. D. Boshen

[57] ABSTRACT

Gold films (18) of essentially uniform thickness are plated onto respective previously formed palladium films (16) on substrates (10) by loading the substrates into a box plater (20) in opposed relationship to respective anode plates (22). In a plating operation, a plating potential initially is applied across upper end portions of the palladium films (16) and the anode plates (22). The loaded box plater (20) then is lowered into a gold plating bath (28) at a preselected rate to progressively immerse the substrates (10) and the anode plates (22) into the plating bath, such that gold plates onto each palladium film (16) to an essentially uniform thickness. The substrates (10) and anode plates (22) then are left immersed in the plating bath (28) for a total time period dependent upon the desired final thickness of the gold films (18).

10 Claims, 3 Drawing Figures

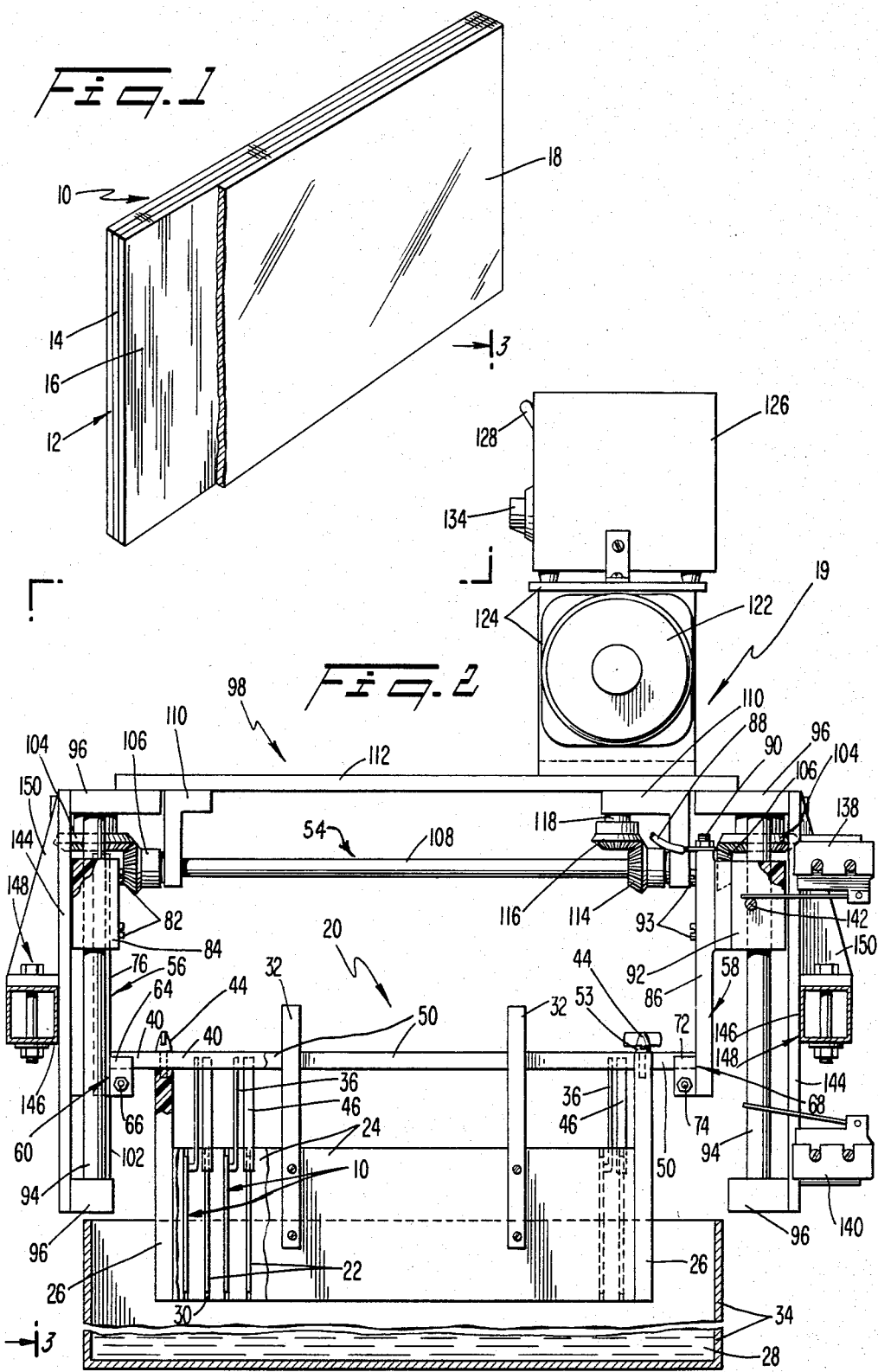

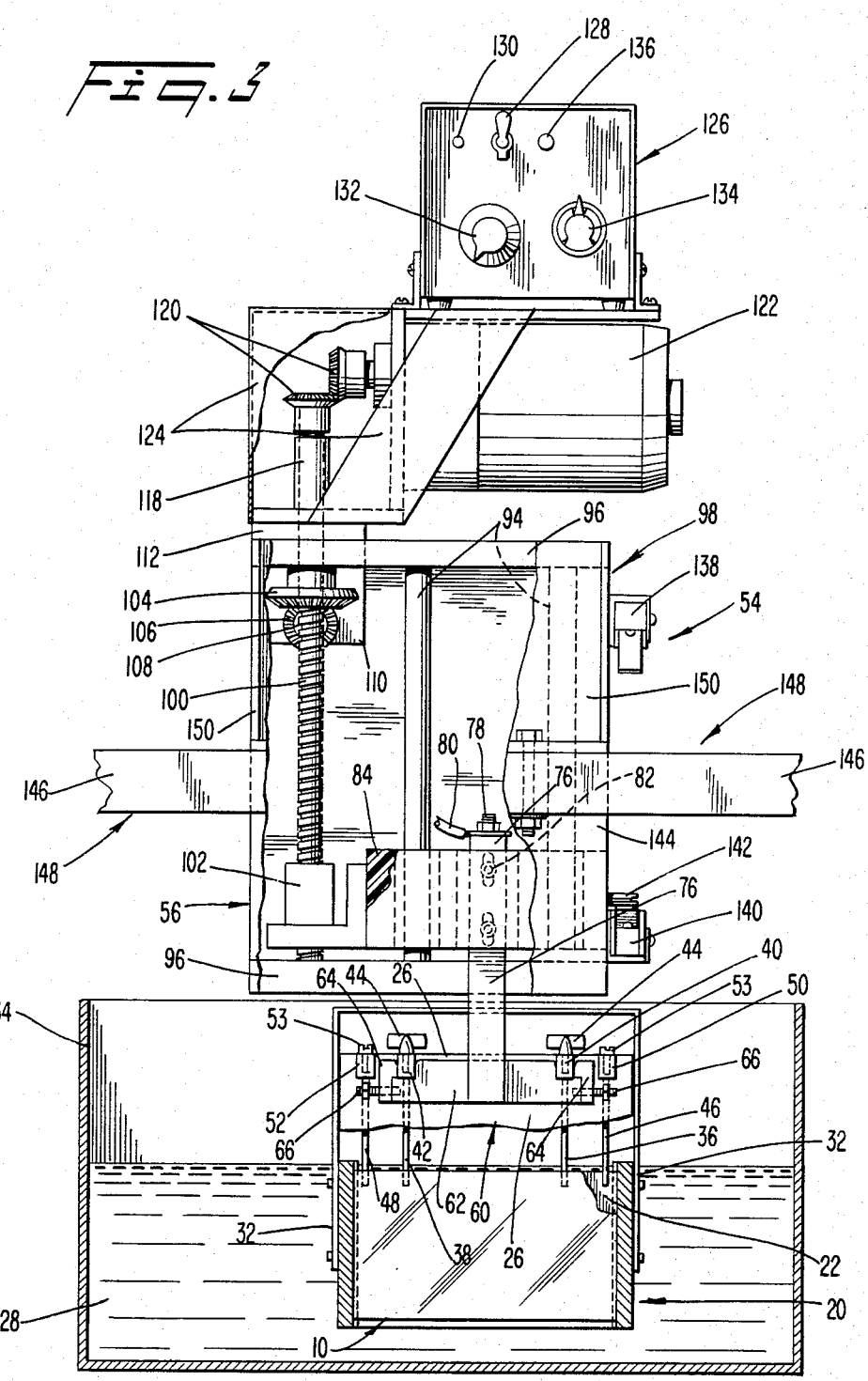

METHOD OF AND APPARATUS FOR PLATING USING CONTROLLED PROGRESSIVE IMMERSION

TECHNICAL FIELD

This invention relates to a method of and apparatus for plating using controlled progressive immersion, and more particularly to a method of and apparatus for plating in which substrates are progressively immersed in a plating solution to achieve uniform plating over surfaces of the substrates.

BACKGROUND OF THE INVENTION

In the manufacture of certain thin film devices, a substrate of each device is provided with a conductive "glue" layer, which comprises a film of palladium and which is applied to the substrate in a sputtering operation to facilitate the adhesion of a subsequently plated gold film to the substrate. In the plating of the gold films on the substrates, the substrates are mounted in a device known as a box plater with the palladium films (cathodes) in opposed relationship to respective anode plates also mounted in the box plater. To facilitate mounting of the substrates and the anode plates into the box plater through the bottom of the plater, and removal of the substrates and the anode plates from the plater through the bottom thereof, only upper ends of the palladium films and the anode plates make electrical contact with respective electrical contact pins for providing plating current to the substrates and the anode plates during a plating operation. The box plater, including the substrates and the anode plates, then is pre-immersed in an electroplating bath and a plating current is applied to the palladium films through the anodes and the plating bath to form the gold films on the palladium films.

However, when palladium-coated substrates are plated with gold in this manner, it has been found that the thickness of the gold film plated onto each substrate is significantly greater adjacent the upper end of the substrate in comparison to the thickness of the gold film adjacent the lower end of the substrate. This is undesirable for various reasons, including the necessity for plating an excessive amount of gold on the substrates adjacent their upper ends in order to insure that a minimum required thickness of gold is present on the substrates adjacent their lower ends. As a result, because of the present high cost of gold, the manufacturing cost of the thin film devices is significantly increased.

Applicant has observed that the above-described gradient in the gold films on the substrates apparently is a result of the gold tending to plate onto the substrates initially in the vicinity of the contact pins in contact with the upper ends of the substrates, and then to plate progressively downward on the substrates to the lower ends thereof. This is attributed, at least in part, to the fact that because the palladium films are electrically contacted only adjacent their upper ends, and because palladium has a high electrical resistivity, in comparison to gold, the current densities in the plating bath initially are highest adjacent the contact pins at the upper ends of the substrates. As a result, gold initially plates onto each substrate adjacent the contact pins, and then progressively downward on the substrate, to form an initial thickness gradient in the plated gold which is retained thereby as additional gold is then plated onto the substrate.

Accordingly, a primary purpose of this invention is to provide a new and improved plating method and apparatus in which an electrically conductive material is plated essentially uniformly over a portion of an article being plated, particularly where the article portion has a high electrical resistivity, so as to reduce the amount of material which must be plated on the article in order to achieve a minimum preselected thickness at each point on the article.

SUMMARY OF THE INVENTION

In general, an electrically conductive material is plated to an essentially uniform thickness onto an electrically conductive portion of an article by initially applying electrical plating potential to the article portion adjacent only an upper end thereof. The article portion then is progressively immersed at a preselected rate into an electroplating solution containing the electrically conductive material as the electrical plating potential is being applied to the article portion, to form a layer of the electrically conductive material of an essentially uniform thickness on the article portion. After the article portion has been completely immersed in the electroplating solution, additional material may be plated onto the article portion.

More specifically, the article is a thin film substrate having a palladium film formed on a portion thereof to be plated. The substrate portion is disposed in opposed relationship to an associated anode for a plating operation. The opposed substrate portion and anode tnen are immersed in a gold electroplating solution simultaneously at a preselected rate, such as 3.6 inches per minute, to plate an initial layer of gold of essentially uniform thickness onto the substrate portion. After the substrate portion to be plated and the opposed anode have become immersed in the gold electroplating solution, additional gold is plated onto tne substrate portion to form a gold layer of an essentially uniform final thickness on the article portion.

BRIEF DESCRIPTION OF THE DRAWINGS

FIG. 1 is an isometric view of a thin film substrate which may be plated utilizing the metnod of the invention;

FIG. 2 is a front elevational view of an apparatus in accordance with the invention; and FIG. 3 is a side elevational view of the apparatus of FIG. 2, as viewed along the line 3—3 in FIG. 2.

DETAILED DESCRIPTION

Referring to FIG. 1, the disclosed embodiment of the invention is directed to the plating of gold on one side of a planar, rectangular thin film metallized substrate 10. For example, the thin film substrate 10 may be of a type utilized in the manufacture of thin film RC networks, as disclosed in the U.S. Pat. No. 4,251,326, issued Feb. 17, 1981, to F. R. Arcidiacono and G. J. Koerckel, and entitled "Fabricating an RC Network Utilizing Alpha Tantalum." In this regard, at an intermediate stage of manufacture of the metallized substrate 10, as illustrated in FIG. 1, the substrate has had portions of the RC networks (not shown) formed thereon, after which a "glue" layer 12, consisting of successive sputtered thin layers of a titanium film 14 and a palladium film 16, has been formed on one side of the substrate to facilitate the adhesion of gold to the substrate. A thin gold layer 18 then may be plated on the palladium 16 utilizing the method and apparatus of this invention. Thereafter, the glue layer 12 and the gold layer 18 are etched in a known manner to form the RC networks (not shown) on the substrate 10. The subject invention also may be used to plate gold onto both sides of the substrate 10 simultaneously, if so desired.

FIGS. 2 and 3 disclose apparatus 19 in accordance with the invention in which the substrates 10 are loaded into a device known in the art as a "box plater" 20 in opposed alternating relationship to planar, rectangular anode plates 22. The anode plates 22 may be alumina substrates metallized with a sputtered "glue" layer of titanium and palladium, a layer of plated gold for high conductivity, and a layer of plated rhodium for chemical inertness, none of which layers are shown. When the substrates 10 are being plated on only one side, as in the disclosed embodiment of the invention, the alumina substrates of the anodes 22 need be metallized on only one side, and the sides of the substrates to be plated are mounted in the box-plater 20 in opposed relationship to respective metallized sides of the anodes. When the substrates 10 are to be plated on both sides, the anodes 22 also are metallized on both sides so that both sides of each substrate are in opposed relationship to respective metallized sides of the anodes when the substrates are mounted in the box plater 20.

The box plater 20 includes opposed side walls 24 and opposed end walls 26 of a suitable plastic material. The side walls 24 and end walls 26 are secured together by screws (not shown) to form a rectangular box having an open top and bottom, to facilitate flow of plating solution in an electroplating bath 28 vertically between the substrates 10 and the anodes 22. Each of the opposed side walls 24 has a row of vertically extending guide grooves 30 formed therein in spaced relationship along the length thereof for the reception of edge portions of respective ones of the substrates 10 or the anodes 22 into the box plater 20 through lower ends of the grooves. A pair of inverted U-shaped carrying handles 32 have opposed legs secured to respective ones of the side walls 24 by suitable screws. The plating bath 28 is contained in a tank 34 provided with solution pumping and nitrogen sparging units (not shown) for plating solution circulation in a known manner.

In the box plater 20 shown in FIGS. 2 and 3, electrical contact with the palladium film 16 (FIG. 1) of each substrate 10 is made through hook-shaped portions (best shown in FIG. 2) on lower ends of a respective pair of first and second spaced vertically disposed contact pins 36 and 38 (one shown in FIG. 3), respectively. The contact pins 36 and 38 are formed from a material which is highly resilient and resistant to gold etching solutions for cleaning purposes, such as titanium or stainless steel. Upper ends of the first contact pins 36 are suitably mounted in an elongated first cathode bar 40, such as by set screws (not shown). Upper ends of the second contact pins 38 are mounted in an identical elongated second cathode bar 42 (FIG. 3) in the same manner. As is best illustrated by the first cathode bar 40 at the left-hand side of FIG. 2, each of the cathode bars 40 and 42 is suitably mounted for horizontal sliding movement in slots formed in upper ends of upwardly projecting extensions of the end walls 26 of the box plater 20, such as by wing nuts 44 screw-threaded onto studs mounted in the end walls and extending upward through elongated slots (not shown) in the bars. Further, as viewed in FIG. 2, left-hand ends of the cathode bars 40 and 42 project outward beyond the adjacent end wall 26 for mounting the box plater 20 in the plating apparatus 19, while right-hand ends (not visible) of the cathode bars terminate adjacent an outer surface of the adjacent opposite end wall 26.

The slidable mounting of the cathode bars 40 and 42, and the engagement of the substrate 10 on only one side by the resilient contact pins 36 and 38 as above described, facilitates loading of the substrates 10 into the box plater 20 and removal of the substrates from the box plater. In this regard, in loading the box plater 20, the box plater is removed from the plating apparatus 19 and positioned in a loading station, not shown. The wing nuts 44 then are loosened so that the cathode bars 40 and 42 can be slid to the right as viewed in FIG. 2, thus moving the contact pins 36 and 38 from an article-clamping position to an article-releasing position, to permit loading of the substrates 10 into their respective grooves 30 through the bottom of the box plater 20. By then sliding the cathode bars 40 and 42 to the left as viewed in FIG. 2, so that the contact pins 36 and 38 are moved back to their article-clamping positions in firm engagement with the substrates 10, the substrates can be releasably clamped in their respective grooves 30 by tightening the wing nuts 44. Similarly, to unload the substrates 10 from the box plater 20, the box plater may be removed from the plating apparatus 19 and positioned on a suitable receptacle, not shown. Then by loosening the wing nuts 44 and moving the cathode bars 40 and 42 to the right, as viewed in FIG. 2 and as previously described, the contact pins 36 and 38 are moved so as to release the substrates 10, which then can drop from the box plater 20 through the bottom thereof into the receptacle by gravity.

Adjacent its upper end, portions of each anode plate 22 are received in slots formed in lower ends of a respective pair of horizontally spaced, vertically disposed first and second electrical contact pins 46 and 48 (one shown in FIG. 3), respectively. The contact pins 46 and 48 are formed from a material which is highly resilient and resistant to anodic corrosion, such as titanium. The slot in the lower end of each contact pin 46 and 48 is defined by a pair of opposed resilient fingers which grip the upper portions of the anode plate 22 to help retain the anode plate in the box plater 20 and to make firm electrical contact with the anode plate during a plating operation.

Upper ends of the first contact pins 46 are suitably mounted in an elongated first anode bar 50, such as by set screws (not shown), and upper ends of the second contact pins 48 (FIG. 3) are similarly mounted in an elongated second anode bar 52. The anode bars 50 and 52 are fixedly mounted by screws 53 in slots formed in the upper ends of the upwardly projecting extensions of the end walls 26 of the box plater 20. As viewed in FIG. 2 and illustrated by the anode bar 50, right-hand ends of the anode bars 50 and 52 project beyond the adjacent right-hand box plater end wall 26 for mounting of the box plater 20 in the plating apparatus 19. The left-hand ends (FIG. 2) of the anode bars 50 and 52, however, terminate adjacent an outer surface of the left-hand box plater end wall 26.

During a plating operation in accordance with the invention, the cathode substrates 10, the box plater 20, and the anodes 22, are progressively lowered into the plating bath 28 by an elevator mechanism 54. As viewed in FIG. 2, the elevator mechanism 54 includes a left-hand support assembly 56 and a right-hand support assembly 58 at respective opposite sides of the apparatus 19, for this purpose.

The left-hand support assembly 56 includes a horizontal contact bar assembly 60. As is best shown in FIG. 3, the contact bar assembly 60 includes a pair of suitably spaced upwardly opening slots for receiving the projecting ends of the cathode bars 40 and 42 of the box plater 20. More specifically, each of the slots for receiving the cathode bars 40 and 42 is defined by a right-angle notch formed in one end of a contact bar 62, and by a surface of a spring-loaded clamping member 64 slidably mounted on a horizontal pin 66 screw-threaded into the end of the contact bar. Similarly, the right-hand support assembly 58 (FIG. 2) includes a horizontal contact bar assembly 68 having a pair of upwardly opening slots (only one shown) for receiving the projecting ends of the anode bars 50 and 52 of the box plater 20. As in the case of the contact bar assembly 60, each of the slots for receiving the anode bars 50 and 52 is defined by a right-angle notch formed in one end of a contact bar (not shown), and by a surface of a spring-loaded clamping member 72 (FIG. 2) slidably mounted on a pin 74 (FIG. 2) screw-threaded into the end of the contact bar.

As is best shown in FIG. 3, the cathode contact bar 62 is fixedly mounted, such as by welding, to a lower end of a vertical cathode post 76. An upper end of the cathode post 76 carries a terminal stud 78 having an electrical cable 80 secured thereto. The vertical cathode post 76 is adjustably mounted, such as by screws 82, on a vertically movable electrical insulating block 84. Similarly, the anode contact bar (not shown) of the contact bar assembly 68 is fixedly mounted on a lower end of a vertical anode post 86 (FIG. 2) having an electrical cable 88 secured to a terminal stud 90 on an upper end of the post. The anode post 86 also is adjustably mounted for vertical movement on a vertically movable electrical insulating block 92 by suitable screws 93.

Each of the electrical insulating blocks 84 and 92 is mounted for vertical movement on a respective pair of vertically extending guide posts 94 extending through suitable bushings in the block and mounted at upper and lower ends in horizontal support members 96 of an apparatus frame 98. As shown in FIG. 3 by the electrical insulating block 84, each of the electrical insulating blocks 84 and 92 is raised and lowered by a respective vertical drive screw 100 extending through a drive bushing 102 mounted on the insulating block, with upper and lower ends of the drive screw being journaled in respective ones of the upper and lower frame support members 96.

Each drive screw 100 is driven by a gear member 104 mounted adjacent the upper end of the screw and engaged with a gear member 106 on an adjacent end of a horizontal drive shaft 108. The drive shaft 108 is journaled in spaced depending brackets 110 (FIG. 2) mounted on a horizontal top plate 112 of the apparatus frame 98. The drive shaft 108 is driven by a gear member 114 (FIG. 2) engaged with a gear member 116 (FIG. 2) on a lower end of a vertical drive shaft 118 journalled in the top plate 112. The vertical drive shaft 118 is driven through gear members 120 (FIG. 3) by a reversible, variable speed electric motor 122 suitably mounted on the top plate 112 by a support assembly 124. A speed control unit 126 for the motor 122 is mounted on top of the support assembly 124.

The motor 122 and the associated speed control unit 126 may be of any suitable type, such as the adjustable speed/torque drive motor model #526 and a #901 speed control unit available from the Bodine Company of Chicago, Ill. In this regard, as is best shown in FIG. 3, the motor speed control unit 126 includes an on-off switch 128, an indicating light 130, a speed control knob 132 and an associated potentiometer (not shown), a direction control switch 134 movable between "down" and "up" positions, and a reset button 136. Vertical travel of the elevator mechanism 54 as it is driven by the motor 122 is limited by upper and lower limit switches 138 and 140, respectively, which are operable by an actuating pin 142 projecting from the second electrical insulating block 92. The limit switches 138 and 140 are mounted on one of a pair of side plates 144 of the apparatus frame 98. The side plates 144 are mounted on horizontal support bars 146 of a support frame 148, the remainder of which is not shown, by triangular-shaped bracket members 150.

In carrying out the invention, after the box plater 20 has been loaded with substrates 10 to be plated, the box plater is mounted in the elevator mechanism 54 as shown in FIG. 2, by positioning the projecting end portions of the cathode bars 40 and 42, and of the anode bars 50 and 52, in the slots in their respective contact bar assemblies 60 and 68, respectively. A plating potential then is applied across the substrates 10 and the anodes 22 from a suitable power supply, not shown, such as the "Digi Plate 1221" 100 ampere pulsed DC power supply of the Nova Tran Corporation of Clear Lake, Wis. Further, the motor speed control knob 132 and the associated potentiometer (not shown) of the motor control unit 126 is set to produce a preselected lowering speed of the motor 122, and the motor direction switch 134 is set in its "down" position. The motor on-off switch 130 then is operated to energize the motor 122, which then begins to cause lowering of the elevator mechanism 54 and thus the box plater 20, including the substrates 10 and the anodes 22 therein, at a preselected controlled rate toward and into the plating bath 28 so as to progressively plate a thin initial gold layer on each substrate from the lower to the upper end thereof. In this regard, while favorable results have been achieved with a constant rate of immersion, it is considered to be within the purview of the invention to use a variable rate of immersion, if so desired.

More specifically, in accordance with the theory of this invention, as the lower ends of the substrates 10 and the anodes 22 begin to enter the plating bath 28, a constant plating current of an initial high density is established between the lower ends of the substrates 10 and the lower ends of the anodes 22, and gold initially begins to plate on lower portions of the substrates. As the substrates 10 and anodes 22 then continue to be moved downward into the plating bath 28, gold is progressively plated onto the substrates from their lower ends toward their upper ends as the substrates become immersed into the plating bath. In this regard, the rate of immersion of the substrates 10 and the anodes 22 is selected so that when the substrates and the anodes have become fully immersed in the plating bath 28, the thickness of the gold which has plated onto each substrate will have only a slightly decreasing gradient from the lower end to the upper end of the substrate, whereby the initially deposited layer of gold is of essentially uniform thickness. Thereafter, apparently as a result of current densities in the plating bath 28 tending to equalize throughout the plating bath, it has been found that additional gold then plates onto the initially formed gold layer in a manner such as to produce a completed gold film 18 (FIG. 1) which is essentially uniform in final thickness, although slightly thinner in intermediate portions of each substrate than adjacent the upper and lower ends thereof, as is apparent from the examples subsequently described herein.

After the substrates 10 have become immersed in the plating bath 28, lowering of the substrates is interrupted by the actuating pin 142 in the electrical insulating block 92 operating the lower limit switch 140 to de-energize the motor 122 as above described. Then, after the substrates 10 have been immersed in the plating bath 28 for a sufficient period of time to produce a desired thickness of the gold film layers 18 thereon, as noted hereinabove, power to the box plater 28 is interrupted in a known manner by a suitable timer (not shown), such as the model AMC 6001 ampere-time meter and controller available with the above-mentioned power supply from the Nova Tran Corporation. The motor 122 then is energized in a reverse direction by moving the direction control switch 134 in the motor control unit 126 to its "up" position, to raise the elevator mechanism 54 and thus the box plater 20, including the substrates 10 and the anodes 22, from the plating bath 28. Upward movement of the elevator mechanism 54 then is interrupted by the actuating pin 142 operating the upper limit switch 138 to de-energize the motor 122. After a suitable draining period above the plating bath 28, to eliminate excessive "dragout" of gold plating solution, the box plater 20 is removed from the apparatus 19 for additional processing of the substrates 10.

The following are examples illustrating embodiments of the invention:

EXAMPLE I

A first substrate formed with 2400 Å of palladium on one side thereof was plated with gold using a prior known method in which the substrate was completely pre-immersed in a gold cyanide plating bath prior to the start of the plating operation. A second identical substrate was plated with gold in accordance with this invention, utilizing controlled progressive immersion in the gold cyanide plating bath at a rate of 3.6 inches per minute during the initial phase of the plating operation. The plating bath was maintained at 65° C.±1° C. and was composed of 50 grams per liter dibasic ammonium citrate, 50 grams per liter ammonium sulphate and 15 grams of gold per liter in the form of potassium gold cyanide. In each plating operation the plating current was pulsed DC having a value of 2.7 amperes, which was alternately ON for 9.9 milliseconds and OFF for 99 milliseconds respectively. The total plating time in each plating operation was 11 minutes.

The gold deposited on each substrate was measured and found to be essentially equal, namely, 0.3294 grams on the first substrate and 0.3287 grams on the second substrate, respectively. The thicknesses of the deposited gold film was measured adjacent each side and at the center of each substrate at five different vertical levels. The thickness on the first substrate plated in accordance with the prior known pre-immersion method varied from 14,300 Å adjacent the lower end (level five) of the substrate, to 20,900 Å adjacent the upper end (level one) of the substrate, for a range in thickness differential of 6,600 Å. The thickness on the second substrate plated utilizing the controlled progressive immersion method of this invention varied from 16,500 Å adjacent an intermediate lower portion (level four) of the substrate to 18,900 Å adjacent the upper end (level one) of the substrate, for a range in thickness differential of only 2,400 Å and an improvement in gold film thickness uniformity on the order of 60%.

EXAMPLE II

First and second substrates each formed on one side with 2400 Å of palladium were plated with gold as described in Example I using the prior known pre-immersion method and the controlled progressive immersion method of this invention, respectively, but with the total plating time reduced to five minutes. The amount of gold deposited on the first and second substrates was again found to be essentially equal, namely, 0.1476 grams on the first substrate and 0.1475 grams on the second substrate, respectively. The thickness of the deposited gold film on the first substrate was found to vary from 5,600 Å adjacent the lower end (level five) of the substrate to 11,600 Å adjacent the upper end (level one) of the substrate, for a range in thickness differential of 6,000 Å. In contrast, the thickness of the gold film deposited on the second substrate varied from 7,400 Å adjacent the middle (level 3) of the substrate, to 8,600 Å adjacent the lower end (level five) of the substrate, for a range in thickness differential of only 1,200 Å and an improvement in gold film thickness uniformity of 80%.

EXAMPLE III

First and second substrates plated with 300 Å of palladium on one side thereof were plated with gold in the gold cyanide plating bath of Example I at 65° C.±1° C. using the prior known pre-immersion method and the controlled progressive immersion method of this invention, respectively. As in Examples I and II, the rate of progressive immersion was 3.6 inches per minute. The plating current in each plating operation was 1.4 amperes pulsed D.C. which was alternately ON for 9.9 milliseconds and then OFF for 28 milliseconds, respectively. The total plating time in each plating operation was 2.25 minutes.

As in Examples I and II, the gold deposited on each substrate was found to be essentially equal, namely, 0.1450 grams on the first substrate and 0.1463 grams on the second substrate, respectively. The thickness of the deposited gold film on the first substrate plated using the prior known pre-immersion method varied from 2,900 Å adjacent the lower end (level 5) of the substrate, to 12,400 Å adjacent the upper end (level 1) of the substrate, for a range in thickness differential of 9,500 Å. The thickness of the deposited gold film on the second substrate plated using the controlled progressive immersion method of the subject invention, however, varied from 6,600 Å adjacent an intermediate lower portion (level 4) of the substrate, to 9,400 Å adjacent the upper end (level 1) of the substrate, thus producing a range in thickness differential of only 2,800 Å, for an improvement in gold film thickness uniformity on the order of 73%.

EXAMPLE IV

First and second sets of 36 substrates each formed on one side with 2,400 Å of palladium were successively mounted in the same box plater and plated in successive first and second plating runs in the gold cyanide plating bath of Example I at 65° C.±1° C. utilizing the prior known pre-immersion plating method and the controlled progressive immersion plating method of this invention, respectively. As in Examples I, II and III, the immersion rate using the method of this invention was 3.6 inches per minute. The plating current in each instance was 97.2 amperes pulsed DC which was alternately ON for 9.9 milliseconds and then OFF for 28 milliseconds, respectively. The total plating time for each plating run was 4.75 minutes.

The average weight of gold deposited on each of the first and second substrates was found to be essentially equal, namely, 0.3370 grams on each of the first substrates and 0.3330 grams on each of the second substrates. After each plating run, substrates were removed from positions 6, 12, 18, 24 and 30 in the box plater and the thicknesses of gold deposited on each substrate were determined at five horizontally spaced points located on each of five vertically spaced levels on the substrate. The average thickness of gold film deposited on the first substrates plated utilizing the prior known pre-immersion method was found to vary from 14,000 Å adjacent the lower end (level five) of the substrates, to 21,000 Å adjacent the upper end (level one) of the substrates, for a range in thickness differential of 7,000 Å. In contrast, the average thickness of gold film deposited on the second substrates utilizing the controlled progressive immersion method of this invention was found to vary from 15,600 Å adjacent the middle (level three) of the substrates, to 19,000 Å adjacent the upper end (level one) of the substrates, for a range in thickness differential of only 3,400 Å and an improvement in gold film thickness uniformity on the order of 51%.

EXAMPLE V

The plating and gold film thickness measuring steps as described in Example IV were repeated, except that the plating current value was reduced to 48.6 amperes and the total plating time was reduced to 3 minutes and 50 seconds. The average weight of gold deposited per substrate for both the first substrates and the second substrates was found to be equal, namely, 0.1530 grams. The average thickness of the gold film deposited on the first substrates plated utilizing the prior known pre-immersion method was found to vary from 6,000 Å adjacent the lower end (level five) of the substrates, to 11,000 Å adjacent the upper end (level one) of the substrates, for a range in thickness differential of 5,000 Å. However, the average thickness of the gold film deposited on the second substrates plated utilizing the controlled progressive immersion method of the subject invention was found to vary from 6,600 Å adjacent the middle (level three) of the substrates, to 9,600 Å adjacent the upper end (level one) of the substrates, to produce a range in thickness differential of only 3,000 Å and an improvement in gold film thickness uniformity on the order of 40%.

In summary, a relatively simple and economical method of and apparatus for forming a gold film of essentially uniform thickness, such as the gold film 18 (FIG. 1), over a previously formed "glue" layer film of higher electrical resistivity, such as the palladium film 16 on the substrate 10, has been disclosed. The invention involves initially loading a plurality of the substrates 10 into the box plater 20, in which only upper end portions of the palladium films 16 on the substrates are engaged by the electrical contact pins 36 and 38 so as to facilitate substrate loading and unloading through the bottom of the box plater. The loaded box plater 20 then is positioned in the elevator mechanism 54 of the plating apparatus 19 as shown in FIG. 2. With electrical plating potential being applied between the substrates 10 and the anodes 22 in the box plater 20, the box plater then is progressively lowered by the elevator mechanism 54 at a preselected rate, such as 3.6 inches per minute, to immerse the substrates and anodes in the plating bath 28. As a result, gold is plated onto the palladium films 16 on the substrates 10 such that after the substrates have become completely immersed in the plating bath for a short time period, as shown in FIG. 3, the thickness of the gold film 18 which has initially plated onto each substrate is essentially uniform in nature, with a slightly decreasing gradient from the lower ends to the upper ends of the substrates. Thereafter, the substrates 10 are left immersed in the plating bath 28 for an additional time period dependent on the desired final thickness of the gold films 18 on the substrates, during which additional period gold plates onto the initially formed gold films at an essentially uniform rate such that each finally formed gold film also is of essentially uniform thickness.

What is claimed is:

1. A method of plating an essentially uniform thickness of an electrically conductive material onto an electrically conductive portion of an article, which comprises the steps of:

supporting the article above an electroplating bath containing the electrically conductive material such that a lower end of the electrically conductive portion of the article is adjacent the electroplating bath;

electrically contacting the electrically conductive portion of the article adjacent only an upper end thereof to apply electrical plating potential to the article portion; and progressively immersing the article portion, lower end first, at a preselected rate into the electroplating bath as the electrical plating potential to being applied to the article portion, such that successive sections of the article portion between the upper and lower ends thereof are continuously immersed in the electroplating bath for progressively increasing time periods, with the lower end of the article portion being continuously immersed in the electroplating bath for the longest time period and the upper end of the article portion being continuously immersed in the electroplating bath for the shortest time period, respectively, to form a layer of the electrically conductive material of an essentially uniform thickness on the article portion.

2. The method as recited in claim 1, which further comprises the steps of:

disposing an anode above the electroplating bath such that a lower end of the anode is adjacent the electroplating bath and an upper end of the anode is further removed from the electroplating bath;

disposing the article portion to be plated in opposed relationship to the anode;

electrically contacting the article portion and the anode adjacent only the upper ends thereof to apply the electrical plating potential across the article portion and the anode; and progressively immersing the opposed article portion and anode, lower ends first, into the electroplating bath simultaneously as the plating potential is being applied across the article portion and the anode.

3. The method as recited in claim 1, in which the electrically conductive portion of the article has a higher electrical resistivity than the electrically conductive material, in which the progressive immersion of the article portion in the electroplating bath forms the layer of the electrically conductive material on the article portion to an essentially uniform initial thickness, and which further comprises the step of:

continuing to plate additional electrically conductive material onto the article portion after the article portion has been fully immersed in the electroplating bath, to form the layer of the electrically conductive material on the article portion to an essentially uniform final thickness.

4. The method as recited in claim 3, in which:

the article is a thin film substrate;

the article portion to be plated is a palladium film formed on the substrate; and the electrically conductive material which is plated onto the article portion is gold.

5. The method as recited in claim 1, in which:

the article portion is progressively immersed into the electroplating bath at a rate on the order of 3.6 inches per minute.

6. Apparatus for plating an essentially uniform thickness of an electrically conductive material on an electrically conductive portion of an article, which comprises:

an anode;

means for mounting the anode and the electrically conductive portion of the article in spaced opposed relationship above an electroplating bath containing the electrically conductive material such that lower ends of the article portion and the anode are adjacent the electroplating bath;

means for electrically contacting the electrically conductive portion of the article and the anode adjacent only upper ends of the article portion and the anode, to apply electrical plating potential across the article portion and the anode;

drive means for lowering the mounting means and progessively immersing the article portion and the anode, lower ends first, at a preselected rate into the electroplating bath simultaneously as the plating potential is being applied across the article portion and the anode, such that successive sections of the article portion between the upper and lower ends thereof are continuously immersed in the electroplating bath for progressively increasing time periods, with the lower end of the article portion being continuously immersed in the electroplating bath for the longest time period and the upper end of the article portion being continuously immersed in the electroplating bath for the shortest time period, respectively, to form a layer of the electrically conductive material of an essentially uniform thickness on the article portion; and means responsive to the lowering of the mounting means for de-energizing the drive means when the article portion has become fully immersed in the electroplating bath.

7. Apparatus as recited in claim 6, in which the electrically conductive portion of the article has a higher electrical resistivity than the electrically conductive material, in which the progressive immersion of the article portion in the electroplating bath by the drive means forms the layer of the electrically conductive material on the article portion to an essentially uniform initial thickness, and in which:

the electrically contacting means continues to apply electrical plating potential across the article portion and the anode to cause plating of additional electrically conductive material onto the article portion after the article portion has been fully immersed in the electroplating bath, to form the layer of the electrically conductive material on the article portion to an essentially uniform final thickness.

8. Apparatus as recited in claim 6, in which the plating potential applying means includes:

a cathode bar slidably mounted on the mounting means;

an electrical contact member depending from the cathode bar and engageable with only one side of the article portion adjacent the upper end of the article portion, the contact member being movable with the slidable cathode bar between positions for clamping the article on the mounting means and for releasing the article for removal from the mounting means; and means for releasably clamping the cathode bar and the contact member in the article clamping position.

9. A method of plating an essentially uniform thickness of an electrically conductive material onto an electrically conductive portion of an article, which comprises the steps of:

supporting the article adjacent an electroplating bath containing the electrically conductive material such that the electrically conductive portion of the article has an upper end and a lower end;

electrically contacting the electrically conductive portion of the article adjacent only the upper end thereof, to apply electrical plating potential to the article portion; and immersing the article portion in the electroplating bath in a manner such that successive portions of the article portion between the upper and lower ends of the article portion are immersed in the electroplating bath for progressively increasing time periods as the electrical plating potential is being applied to the article portion, with the lower end of the article portion being continuously immersed in the electroplating bath for the longest time period and the upper end of the article portion being continuously immersed in the electroplating bath for the shortest time period, respectively, to form a layer of the electrically conductive material of an essentially uniform thickness on the article portion.

10. The method as recited in claim 9, in which the electrically conductive portion of the article has a higher electrical resistivity than the electrically conductive material, in which the immersion of the article portion in the electroplating bath forms the layer of the electrically conductive material on the article portion to an essentially uniform initial thickness, and which further comprises the step of:

plating additional electrically conductive material on the article portion with the article portion fully immersed in the electroplating bath, to form the layer of the electrically conductive material on the article portion to an essentially uniform final thickness.

* * * * *